United States Patent [19]
Dantsker et al.

[11] Patent Number: 6,154,026
[45] Date of Patent: Nov. 28, 2000

[54] ASYMMETRIC PLANAR GRADIOMETER FOR REJECTION OF UNIFORM AMBIENT MAGNETIC NOISE

[75] Inventors: Eugene Dantsker, Torrance; John Clarke, Berkeley, both of Calif.

[73] Assignee: The Regents of the University of California, Oakland, Calif.

[21] Appl. No.: 09/069,707

[22] Filed: Apr. 29, 1998

Related U.S. Application Data

[60] Provisional application No. 60/045,172, Apr. 30, 1997.

[51] Int. Cl.$^7$ .................................................. G01R 33/035
[52] U.S. Cl. .......................... 324/248; 324/225; 505/162; 505/846
[58] Field of Search ...................... 324/225, 248; 505/162, 702, 845, 846; 600/409

[56] References Cited

U.S. PATENT DOCUMENTS

| | | | |
|---|---|---|---|
| 5,053,834 | 10/1991 | Simmonds | 324/248 X |
| 5,465,049 | 11/1995 | Matsuura et al. | 324/248 |
| 5,506,200 | 4/1996 | Hirschkoff et al. | 324/248 X |
| 5,548,262 | 8/1996 | Kugai et al. | 324/248 X |

OTHER PUBLICATIONS

W. Eidelloth, et al., "$Yba_2Cu_3O_{7-\delta}$ thin–film gradiometers: Fabrication and performance," Appl. Phys. Lett., 59 (26), Dec. 23, 1991, pp. 3473–3475, American Institute of Physics.

R. H. Koch, "Three SQUID gradiometer," Appl. Phys. Lett., 63 (3), Jul. 19, 1993, pp. 403–405, American Institute of Physics.

G. M. Daalmans, et al., "Single Layer YbzCuO—Gradiometer," IEEE Transactions on Applied Superconductivity, vol. 5, No. 2, Jun. 1995, pp. 3109–3112.

V. Schultze et al., "Integrated SQUID Gradiometers for Measurement in Disturbed Environments," IEEE Transactions on Applied Superconductivity, vol. 7, No. 2, Jun. 1997, pp. 3473–3476.

Y. Tavrin, et al., "A $Yba_2Cu_3O_7$ Thin Film Squid Gradiometer for Measurements In Unshielded Space," IEEE transactions on Applied Superconductivity, vol. 3, No. 1, Mar. 1993, pp. 2477–2480.

M. I. Faley, et al., "DC–SQUID Magnetometers and Gradiometers on the Basis of Quaisplanar Ramp–Type Josephson Junctions," IEEE Transactions on Applied Superconductivity, vol. 7, No. 2, Jun. 1997, pp. 3702–3705.

D. Koelle, et al., "High Performance dc SQUID Magnetometers With Single Layer $Yba_2Cu_3O_{7-x}$ Flux Transformers," Appl. Phys. Lett., 63 (26), Dec. 27, 1993, pp. 3630–3632, American Institute of Physics.

D. Koelle, et al., "dc SQUID Magnetometers From Single Layers of $Yba_2Cu_3O_{7-x}$," Appl. Phys. Lett., 63 (16), Oct. 18, 1993, pp. 2271–2273, American Institute of Physics.

Zimmerman, "SQUID Instruments and Shielding for Low–Level Magnetic Measurements," Journal of Applied Physics, pp. 702–710, vol. 48, No. 2 Feb. 1977.

Clarke, "SQUID Fundamentals, " SQUID Sensors; Fundamentals, Fabrication and Applications, pp. 1–62, Kluwer Academic Publishers, 1996.

*Primary Examiner*—Gerard Strecker
*Attorney, Agent, or Firm*—Coudert Brothers

[57] ABSTRACT

An asymmetric planar gradiometer for use in making biomagnetic measurements. The gradiometer is formed from a magnetometer which is inductively-coupled to the smaller of two connected loops patterned in a superconducting film which form a flux transformer. The magnetometer is based on a SQUID formed from a high $T_c$ superconducting material. The flux transformer and magnetometer may be formed on separate substrates, allowing the baseline to be increased relative to presently available devices.

13 Claims, 4 Drawing Sheets

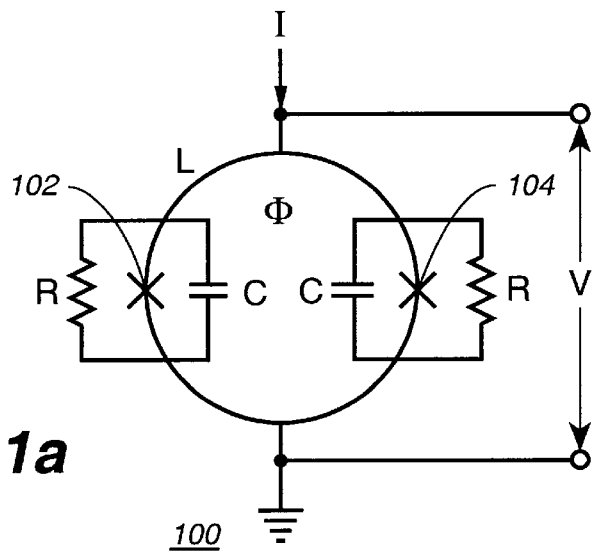
FIG._1a
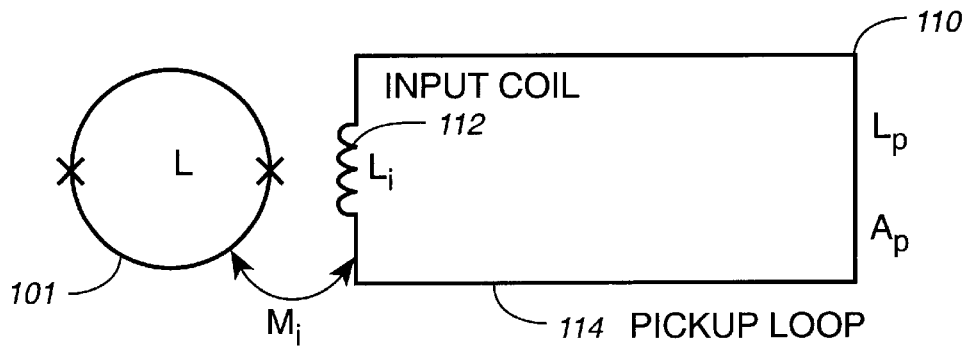
FIG._1b
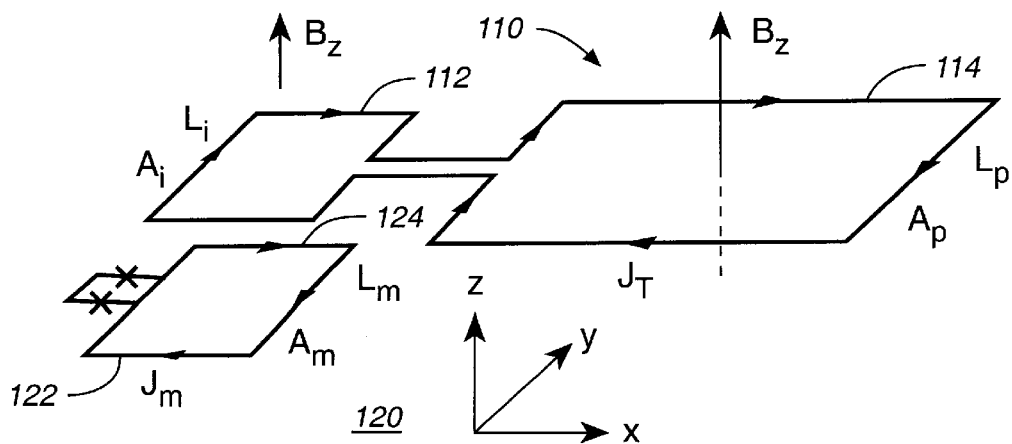
FIG._2

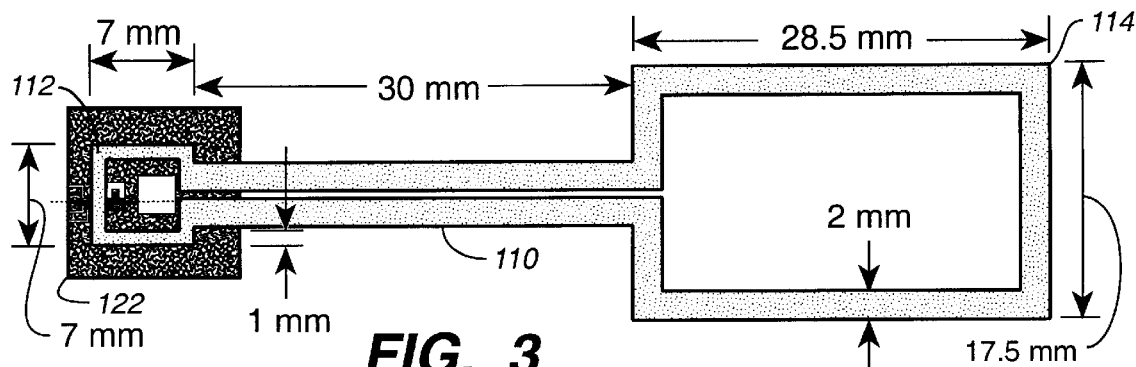
FIG._3
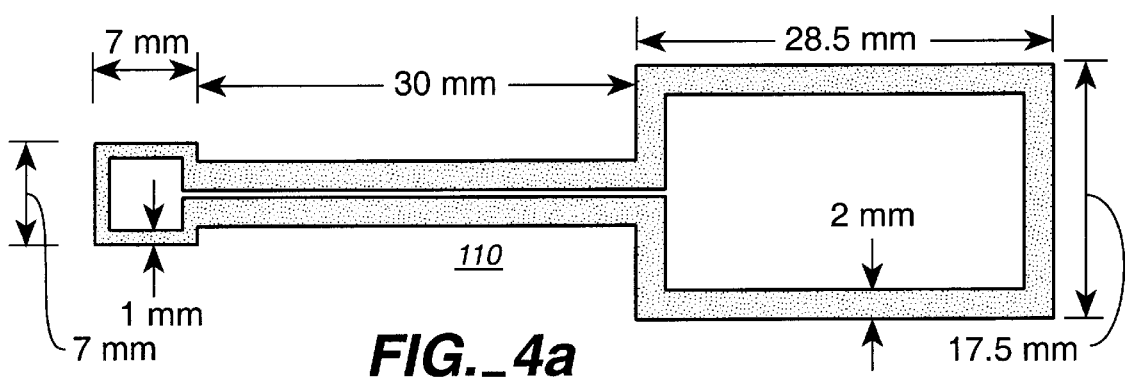
FIG._4a
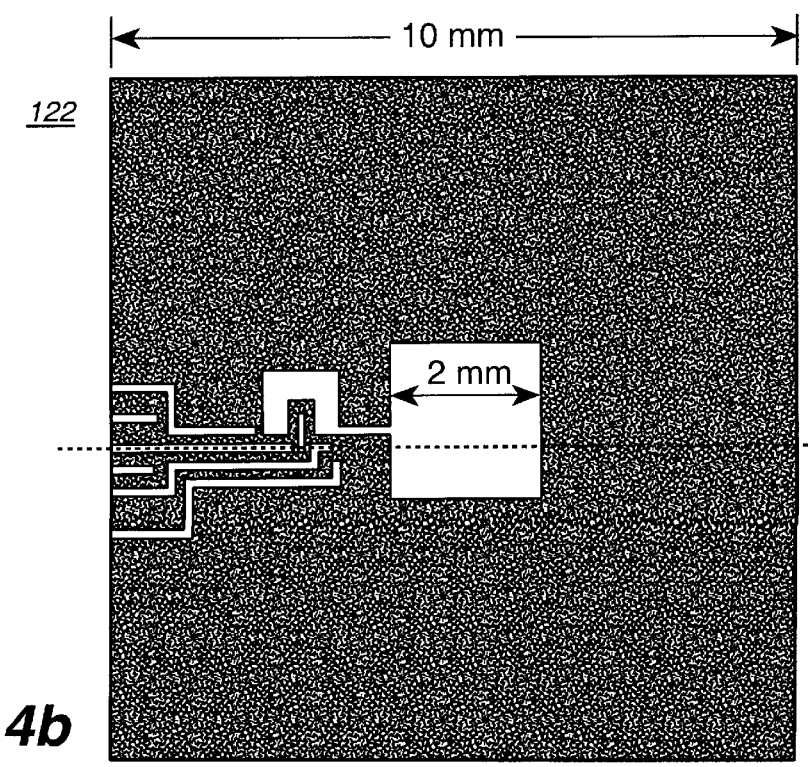
FIG._4b

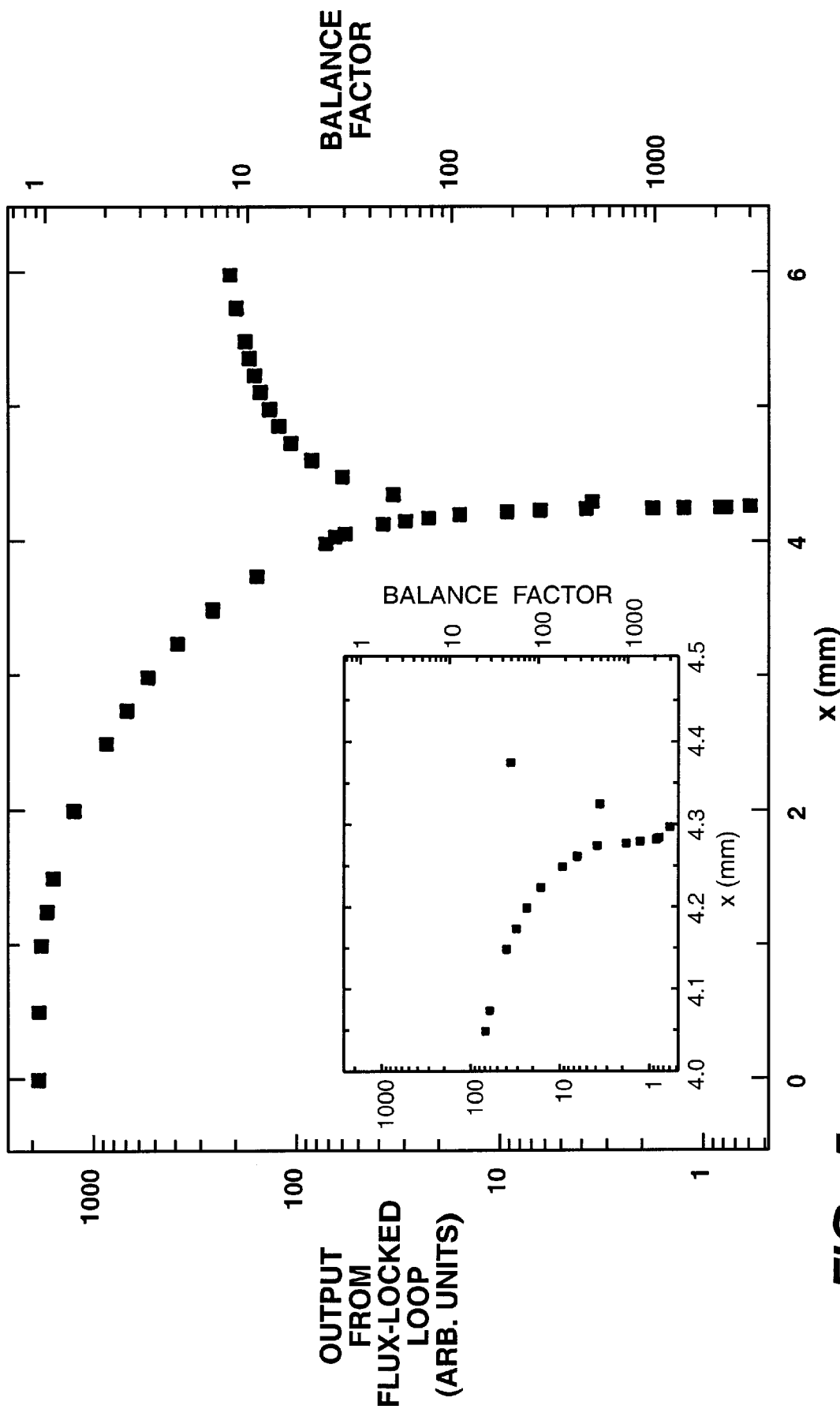
FIG._5

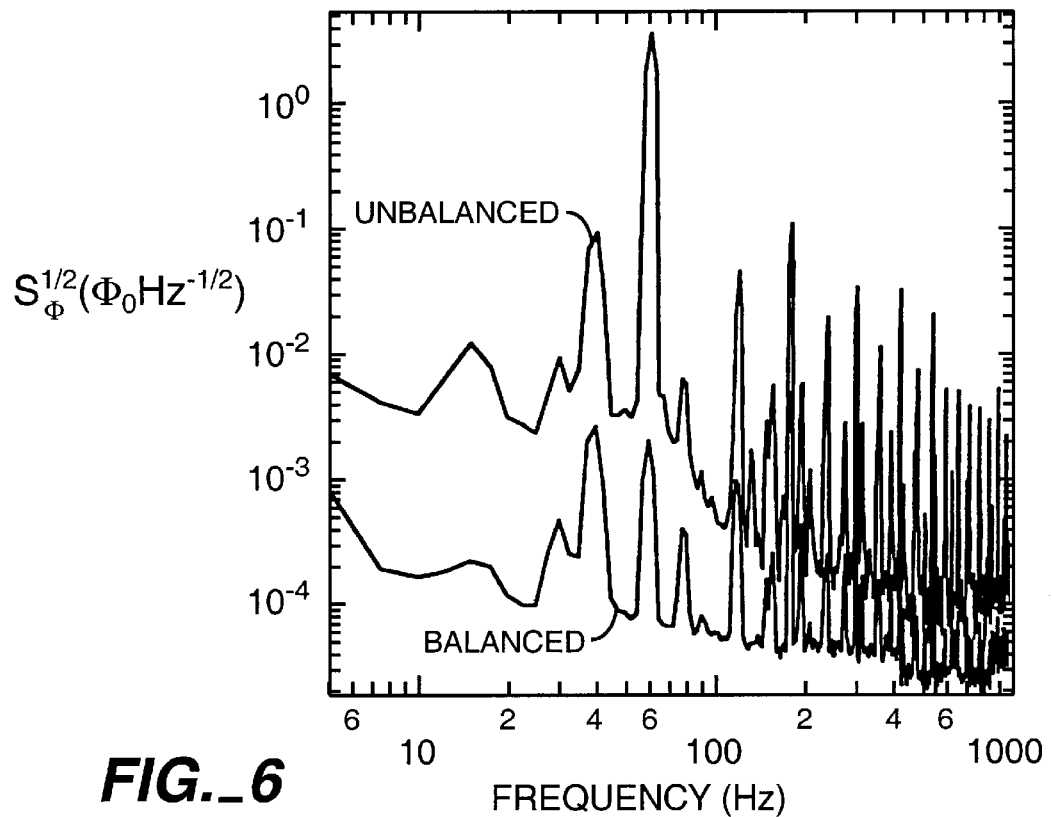
FIG._6
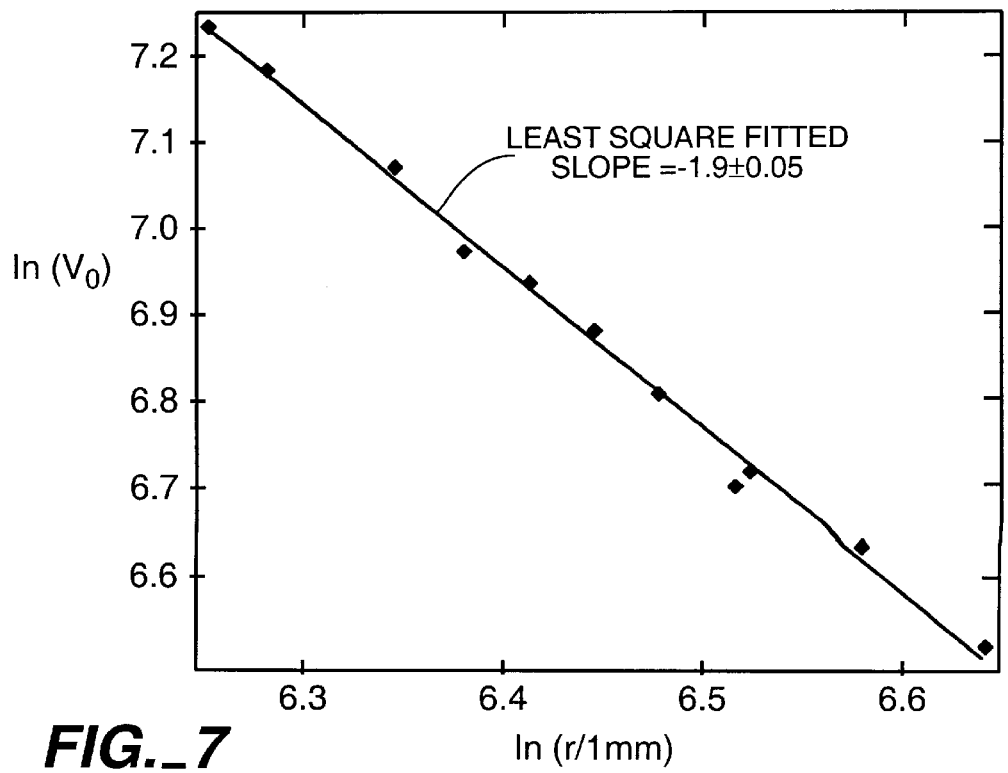
FIG._7

ASYMMETRIC PLANAR GRADIOMETER FOR REJECTION OF UNIFORM AMBIENT MAGNETIC NOISE

RELATED APPLICATION

This is a nonprovisional application based on and which claims the benefit of the copending provisional application entitled "Asymmetric Planar Gradiometer" having provisional application Ser. No. 60/045,172, filed Apr. 30, 1997, and incorporated herein by reference.

This invention was made with U.S. Government support under contract number DE-AC03-76SF00098 between the U.S. Department of Energy and the University of California for the operation of Lawrence Berkeley Laboratory. The U.S. Government may have certain rights in this invention.

BACKGROUND OF THE INVENTION

1. Field of the Invention

The present invention relates to apparatus for the measurement of magnetic fields, and more specifically, to a gradiometer based on a superconducting magnetometer which may be used to measure the magnitude of a weak magnetic field from a nearby source in the presence of a stronger background field.

2. Description of Related Art

Magnetometers are devices which are used to measure the change in magnitude of a magnetic field. Sensitive magnetometers have been constructed from superconducting quantum interference devices (SQUIDs). A SQUID is a magnetic flux detector which transduces the flux into a voltage as an output signal. A SQUID can be used for a range of applications in which physical phenomena are converted to magnetic flux, e.g., current, voltage, magnetic field, and magnetic field gradient can all be measured or inferred via magnetic flux measurements.

A dc SQUID may be formed from two "weak links", that is a material in which a local breakdown of the superconducting property is not accompanied by a global loss of the superconducting properties. In such a configuration, the SQUID is constructed by connecting two weak link devices in parallel in a closed loop of superconducting material and biasing them with a static current. A commonly used weak link device from which a SQUID may be formed is a Josephson tunnel junction. A SQUID sensor (sometimes referred to as a SQUID) may be formed from one or more Josephson junctions arranged in a superconducting loop. A signal can be inductively coupled through an input coil or directly injected into the SQUID.

A SQUID based magnetometer is formed from a SQUID sensor and some form of pickup device for coupling a signal to the SQUID sensor. An applied magnetic field creates a current in the pickup coil which is inductively coupled to the SQUID via an input coil. A magnetometer may also be formed by directly connecting a pickup coil to a SQUID sensor. This is termed a "directly coupled magnetometer". A SQUID based magnetometer has several advantages over other commonly used magnetic sensors, including extremely high sensitivity, broad bandwidth, and small size. A gradiometer is a device which measures the gradient of a magnetic field, i.e., the variation in magnetic field strength ($\delta B$) across a known distance. It may also be used to make measurements of a source magnetic field in the presence of a background field in situations in which the source field changes sufficiently over the dimensions of the gradiometer.

An important characteristic of a superconducting material is its critical or transition temperature, $T_c$. This is the temperature below which the material exhibits its superconducting behavior. Thus, if the material is kept at a temperature above the critical temperature, the superconducting properties will disappear. Superconducting materials may broadly be classified as "low $T_c$" and "high $T_c$" materials. Low $T_c$ materials are those which must be cooled below the boiling point of liquid nitrogen, typically by liquid helium (4.2 degrees Kelvin), to exhibit superconductivity; high $T_c$ materials can be cooled by liquid nitrogen (77 degrees Kelvin) and still exhibit superconductivity. This is a significant difference because liquid nitrogen is less expensive, easier to handle and store, and evaporates much more slowly than liquid helium.

A SQUID may be used with a flux transformer in order to increase a SQUID based magnetometer's sensitivity. A flux transformer is a closed loop of superconductor consisting of a large area pick-up loop and an input coil. The input coil is inductively coupled to the SQUID via a mutual inductance. This forms a magnetometer of the type described above, in which the pickup loop and SQUID sensor input coil are directly electrically connected to form a flux transformer. Placement of the pickup loop in a magnetic field generates a current of magnitude $\Phi/L$ (where $\Phi$ is the magnetic flux through the pickup loop and L is the total inductance of the flux transformer) in the input coil. This current couples a magnetic flux into the SQUID, with the magnitude of the flux being equal to the product of the magnitude of the current generated in the flux transformer and the mutual inductance between the input coil and SQUID. In order to achieve a high coupling efficiency between the flux transformer and the SQUID, the input coil of the flux transformer (i.e., the SQUID sensor input coil) may be fabricated as a planar spiral in a film arranged directly over the SQUID in what is termed a "square washer" configuration.

Excess noise has been a serious limitation to the sensitivity of SQUID-based devices. This noise typically arises from two sources. First, there is ambient noise arising from a variety of background sources, including fluctuations in the Earth's magnetic field, power lines, electrical appliances, etc. Second, there is a noise source arising from magnetic flux vortices which penetrate a superconducting film as it is cooled in a static ambient magnetic field (in particular, the Earth's magnetic field). The present invention is primarily concerned with the measurement problems arising when attempting to measure a relatively weak magnetic field signal from a source in the presence of stronger, fluctuating background magnetic fields. An invention directed to reducing the measurement noise associated with the penetration of a superconducting film by flux vortices is described and claimed in U.S. patent application Ser. No. 09/032,171, now U.S. Pat. No. 6,023,161, entitled "Low-Noise SQUID", filed Feb. 27, 1998, assigned to the assignee of the present invention, and the contents of which are incorporated herein by reference.

In many applications of SQUIDS, particularly biomagnetic measurements such as magnetoencephalography and magnetocardiology, it is necessary to measure relatively weak magnetic signals from a nearby source in the presence of a much higher background field. One approach to solving this problem is to use a magnetically-shielded enclosure with a magnetometer, a spatial gradiometer (assuming the source field falls off rapidly enough over the dimensions of the gradiometer), or a combination of both.

In the case of low-critical temperature ($T_c$) SQUIDs, an axial gradiometer formed from a SQUID sensor and two pickup loops has been developed. The two loops are wound in opposite directions from niobium wire and connected by a common line to the SQUID sensor input coil which inductively couples a flux into the SQUID. A uniform magnetic field across the two pickup loops provides the same flux through each of the loops, thereby generating oppositely directed currents of the same magnitude in the two loops. Thus, in the presence of a time varying, uniform ambient field, the loops generate no net current in the input coil, and no net magnetic flux signal is inductively coupled into the SQUID. The result is that the effect of a uniform background noise source is effectively removed from the measurement. On the other hand, if the magnetic fields through the two pick up loops differ, the magnetic field gradient produces a signal proportional to the magnitude of the field gradient. This permits measurement of the first order derivatives, e.g., $\partial B_z/\partial Z$, of the magnetic field (where $B_z$ is the component of the magnetic field in the z direction). The addition of more loops enables the measurement of higher order derivatives of the magnetic field, e.g., $\partial B_z/\partial z^2$. The distance between the pickup loops (i.e., the baseline for such a device) is typically 50–100 mm. The disadvantages of such devices include the relatively poor "balance" (the ability of the device to cancel out a uniform background field), and the fact that at present time, such designs are limited to operation with low $T_c$ SQUIDs. This approach is currently impracticable for high-$T_c$ devices because of the difficulties of winding coils from high-$T_c$ wire and making superconducting connections between such wires.

Planar, monolithic thin film gradiometers measuring an off-diagonal gradient, such as $\partial B_z/\partial x$, have also been developed. Such devices involve the fabrication of a SQUID and two pickup loops on the same substrate. The pickup loops are of the same dimensions to provide for a substantially equal flux through the two loops (and hence the generation of substantially equal, but opposing currents) and are connected by a common line at their center to the SQUID. In such a design, a uniform magnetic field applied over both pickup loops produces currents of the same magnitude but opposite sense in the two pickup loops. This results in no net current being coupled to the SQUID. Although this design generally has better balance than the niobium wire-wound design, the balance is difficult to adjust after fabrication of the device. In addition, the baseline of the device is limited by presently available fabrication technology, which prevents fabrication of the SQUIDs on a larger substrate.

An alternative approach to using a single magnetometer as the basis for a gradiometer is to subtract the signals electronically from two or more magnetometers to eliminate a uniform, time varying background field and form diagonal or off-diagonal derivatives of the magnetic field. This design permits the use of an arbitrary baseline since the baseline is not limited by the need to fabricate the entire gradiometer on a single substrate. However, the disadvantages of such a design include the relatively higher cost (owing to the use of multiple magnetometers and hence a greater number of SQUIDs), and the higher dynamic range, linearity and slew-rate required.

Even though several types of low $T_c$ SQUID based gradiometers have been constructed, a high $T_c$ device having a longer baseline is desirable. As noted, this is in part because a high critical temperature device requires a relatively inexpensive and more convenient cooling method compared to a device based on a low critical temperature superconductor.

In terms of high-$T_c$ SQUID instruments, gradiometers are presently made in two general ways. In the first method, previously referred to as a planar monolithic gradiometer, a thin film flux transformer with two or more pickup loops is coupled to a SQUID, or, alternatively, the SQUID loop is fabricated in the form of a gradiometer. As noted, in the case of a two pickup loop flux transformer electrically coupled to a SQUID, a uniform ambient magnetic field produces opposite direction currents in the pickup loops. The currents cancel each other out so that no net current is present at the SQUID. However, while this overcomes the critical temperature related disadvantages of low $T_c$ devices, the high $T_c$ devices have generally been limited to baselines of 10 mm or less, a value too small to be useful in most medical applications. As noted, this is because the SQUID and pickup loops are fabricated on a common substrate.

The second technique for fabricating high-$T_c$ SQUID based gradiometers involves the formation of an electronic gradiometer of the type previously described for low $T_c$ devices. In such a device, the outputs of two or more separated SQUID magnetometers are subtracted to form a spatial magnetic field gradient. However, as noted with respect to the low $T_c$ devices, this technique is expensive due to the number of SQUIDs and readout electronics required. The technique is also constrained by the linearity and common-mode rejection ratio of the subtraction electronics and requires high slew rate and dynamic range.

A significant disadvantage of the smaller baseline devices (e.g., planar, monolithic gradiometers) is that the relatively small baseline causes the device to detect the differentiated source signal unless the source signal decreases sufficiently rapidly over the distance of the baseline. This makes such designs inappropriate for some intended applications. In addition, in the case of the planar, monolithic devices, the magnetometer sensitivity is reduced because the applied flux is divided between two pickup loops. This reduces the flux which is sensed by the SQUID in the form of the induced currents. A further, general problem with the described devices is that either the balance is poor or is difficult to adjust after fabrication.

Thus, planar gradiometers, albeit with shorter baselines than desired for biomagnetic measurements, have been fabricated, as have gradiometers which operate by electronic subtraction. However, there has not yet been a demonstration of a high-$T_c$ gradiometer incorporating a flux transformer and having a baseline that is sufficiently long for biomagnetic measurements.

What is desired is a gradiometer having a sufficiently long baseline for use in making biomagnetic measurements and which is based on a high critical temperature superconducting SQUID.

SUMMARY OF THE INVENTION

The present invention is directed to an asymmetric planar gradiometer for use in making biomagnetic measurements. In one embodiment, the gradiometer is formed from a directly-coupled magnetometer having a pickup loop, (hereafter referred to as a magnetometer pickup loop) which is inductively-coupled to the smaller of two connected loops patterned in a film of $Yba_2Cu_3O_{7-x}$, with the two loops forming a flux transformer. The magnetometer is based on a SQUID formed from a high $T_c$ superconducting material. The flux transformer and magnetometer may be formed on separate substrates, allowing the baseline to be increased relative to presently available devices. In operation, a magnetic field which is uniform over the flux transformer produces a current in the transformer which inductively couples a magnetic field of sufficient magnitude into the magnetometer to "cancel" the applied field. The coupling between the flux transformer and magnetometer may be adjusted mechanically to balance the gradiometer to about 1 part in 3,000 with respect to fields perpendicular to its plane. The intrinsic balance with respect to in-plane fields is about 1 part in 1,500. The estimated baseline is 48 mm. When a magnetic field is applied solely to the magnetometer, its estimated sensitivity is reduced by only 5% by the presence of the flux transformer.

BRIEF DESCRIPTION OF THE DRAWINGS

FIG. 1a is a schematic of a dc SQUID which is part of the asymmetric planar gradiometer of the present invention.

FIG. 1b is a schematic of the dc SQUID of FIG. 1a inductively coupled to a flux transformer.

FIG. 2 is a schematic drawing of an embodiment of the asymmetric planar gradiometer of the present invention, showing an asymmetric flux transformer coupled to a directly-coupled magnetometer.

FIG. 3 shows the configuration of the combination of the directly-coupled magnetometer and flux transformer which forms an embodiment of the asymmetric planar gradiometer of the present invention.

FIG. 4(a) shows the configuration of YBCO flux transformer of FIG. 3.

FIG. 4(b) shows the configuration of the directly-coupled magnetometer of FIG. 3.

FIG. 5 is a graph showing the amplitude of the output signal of a flux-locked loop which includes the asymmetric planar gradiometer of the present invention.

FIG. 6 is a graph showing the output of the flux-locked loop for an unshielded gradiometer at unbalanced and optimal balance positions.

FIG. 7 is a graph showing the logarithm of the output signal from the flux-locked loop for an optimally balanced gradiometer versus the logarithm of the distance r of a wire carrying a 100 Hz current below the centerline of the gradiometer.

DETAILED DESCRIPTION OF THE INVENTION

The present invention is an asymmetric, planar gradiometer which measures the $\partial B_z/\partial x$ component of a magnetic field gradient over the baseline of the device. The superconducting asymmetric gradiometer comprises a superconducting magnetometer coupled to an inventive flux transformer. The magnetometer is formed from a SQUID and, in one embodiment, is implemented in a directly coupled magnetometer configuration, i.e., a square pickup loop of YBCO directly connected to opposite sides of a SQUID body. The inventive flux transformer is a closed loop of superconductor material containing a pickup loop and an input loop separated by a distance referred to as the baseline of the device. The transformer's input loop is placed in proximity to the superconducting magnetometer. The gradiometer is fabricated from a thin film of $YBa_2Cu_3O_{7-x}$ (YBCO) and has an estimated baseline of 48 mm. Using a mechanical adjustment to balance the device, a balance for magnetic fields in the z-direction of about 1 part in 3,000 has been achieved.

In operation, an applied magnetic field that is uniform over the baseline of the gradiometer generates a superconducting screening current in the flux transformer that couples a magnetic flux into the magnetometer pickup loop. The flux coupled from the flux transformer to the magnetometer cancels the flux produced in the magnetometer by the applied field. As a result, the magnetometer is relatively insensitive to a magnetic field that is spatially uniform over the baseline, including magnetic field noise generated by power lines, elevators, automobiles, etc. Furthermore, the device is equally insensitive to fields that are static in time and time-varying fields, which include the ambient noise, up to very high frequencies, provided that those fields are spatially uniform over the baseline. However, a magnetic field that is not spatially uniform over the flux transformer baseline will produce a signal in the magnetometer, with the magnetometer responding to the difference in the field between the pickup and input loops of the flux transformer. Thus, in accordance with the present invention, the contribution of the background field at the magnetometer to the overall signal is removed by flux cancellation instead of by generating canceling currents as in the gradiometers known in the art.

Assume that the flux transformer and magnetometer are arranged so that the magnitude of the source magnetic field it is desired to measure is approximately the same over the flux transformer input loop and the pickup loop of the magnetometer. Further, assume that the source magnetic field is such that its strength drops off significantly over the baseline of the device. In such a situation, the flux transformer pickup loop is exposed to a background or ambient field, while the flux transformer input loop and magnetometer pickup loop are exposed to a combination of the background field and the source magnetic field.

When the inventive flux transformer is placed in the ambient field, a current is generated in the transformer to produce a magnetic field to oppose the background field. This flux transformer "screening" current produces a magnetic flux at the magnetometer which cancels the background flux. Thus, the net flux at the magnetometer is that due only to the field which spatially varies over the baseline, i.e., the source field it is desired to measure. In the inventive design, the magnetometer performs the sensing of the desired field, with a uniform background field being removed by flux cancellation. This is in contrast to the gradiometers found in the art which utilize the pickup loops of the flux transformer to remove the response to a uniform magnetic field by generating canceling currents.

The gradiometer of the present invention makes it possible to discern a small local magnetic signal amid a background of stronger magnetic noise. This is important, because when making biomagnetic measurements, it may be necessary to cancel or reject as much as five orders of magnitude of a background signal in order to meaningfully detect a source signal.

In application, the gradiometer is situated so that the end with the magnetometer and the input loop of the inventive flux transformer is close to the source of magnetic field (the source field) being measured, for example the heart of a patient, while the end with the flux transformer pickup loop is some distance away. The source field is spatially non-uniform over the baseline, being much stronger near the magnetometer, while the background noise is much more uniform over the baseline and therefore is largely undetected by the SQUID which is part of the magnetometer. Because the inventive gradiometer design enables the flux transformer pickup loop to be fabricated on a separate substrate from the magnetometer, the present invention permits fabrication of a gradiometer having a longer baseline than monolithic devices. Because of the longer baseline, the inventive design results in increased change in the source signal strength over the dimensions of the flux transformer, resulting in improved background cancellation and signal-to-noise ratio of the detected source field.

As noted, an important parameter used to characterize a gradiometer is its "balance". Balance is the response of a magnetometer coupled to a flux transformer to a spatially uniform magnetic field, divided by the response of the magnetometer alone to the same field. It is thus a measure of the ability of the device to cancel a uniform background field. The balance is critically dependent on the relative areas and self inductances of the pickup loop and the input loop of the flux transformer, and on the inductive coupling between the input loop and the magnetometer. Proper design parameters are therefore very important, as is the ability to balance the gradiometer after it is fabricated to attain maximum background field cancellation.

FIG. 1(a) is a schematic of a dc SQUID which is part of the asymmetric planar gradiometer of the present invention. SQUID 100 consists of two Josephson junctions (elements 102 and 104 in the figure) connected in parallel in a superconducting loop of inductance L. Each junction 102 and 104 has an associated critical current, $I_0$, shunt resistance, R, and capacitance, C. $\Phi$ represents the magnetic flux through the circuit. In operation, a static current greater than $I_0$ is applied to SQUID 100 and the voltage (V) is measured as a function of the applied flux $\Phi$. In this situation, SQUID 100 functions as a flux-to-voltage transducer. The SQUID response is highly nonlinear, and in order to extend the linear range of operation, it is commonly operated in a feedback mode termed a flux-locked loop. In this situation, the SQUID acts as a mixer between a high-frequency modulating flux signal and an applied quasi-static flux signal. FIG. 1(b) is a schematic showing SQUID 100 of FIG. 1(a) inductively coupled to flux transformer 110. This would typically form a magnetometer, however, note that in the present invention, SQUID 101 of FIG. 1(b) is actually a SQUID magnetometer, e.g., a SQUID directly connected to a pickup loop. Flux transformer 110 consists of input coil 112 and pickup loop 114. As noted, in operation, input coil 112 of flux transformer 110 is placed in close proximity to SQUID magnetometer 101. The inductive coupling between SQUID magnetometer 101 and flux transformer 110 (represented as "$M_i$" in the figure) may be improved by fabricating transformer input coil 112 as a planar spiral in a film placed directly over the SQUID 101, where the SQUID 101 is fabricated in what is termed a "square washer" configuration.

FIG. 2 is a schematic drawing of an embodiment of the asymmetric planar gradiometer 120 of the present invention, showing the inventive asymmetric flux transformer 110 coupled to a directly-coupled magnetometer 122. Note that flux transformer 110 is termed asymmetric because pickup loop 114 and input loop 112 are of different sizes. Gradiometer 120 consists of a directly-coupled SQUID magnetometer 122 (which includes a pickup loop 124 of inductance $L_m$ and area $A_m$), and a superconducting flux transformer 110 with an input loop 112 of inductance $L_i$ and area $A_i$ connected to a pickup loop 114 of inductance $L_p$ and area $A_p$. The mutual inductance between magnetometer 122 and input loop 112 is given by $M_i=\alpha(L_m L_i)^{1/2}$, where $\alpha$ is the coupling coefficient and $0<\alpha<1$. As will be discussed, the dimensions and inductances of the flux transformer and magnetometer pickup loop are selected so that the inventive design acts to cancel the flux in the magnetometer produced by a uniform magnetic field.

In order to make accurate measurements of a relatively weak biomagnetic field in the presence of an approximately uniform, but stronger, background signal, it is desirable that the gradiometer be balanced, that is, for the directly-coupled magnetometer to produce zero output in response to a uniform magnetic field $B_z$. Using the principle of flux conservation, it can be shown that $$B_z A_m - L_m J_m - M_i J_t = 0 \qquad (1)$$

and $$B_z(A_p+A_i)-(L_p+L_i)J_t-M_i J_m=0, \qquad (2)$$

where equation (1) describes the flux through magnetometer pickup loop 124, equation (2) describes the flux through transformer loop 114, and $J_m$ and $J_t$ are the screening supercurrents in the magnetometer pickup loop and flux transformer, respectively. To achieve the balance condition $J_m=0$ (i.e., no signal in the magnetometer from the uniform background field), equations (1) and (2) are solved to find a required relationship between the mutual inductance of the magnetometer and input loop of the flux transformer. This relationship may be expressed in terms of a constraint upon the coupling coefficient, i.e, $$\alpha=[A_m/(A_p+A_i)]((L_p+L_i)/(L_i L_m))^{1/2}. \qquad (3)$$

To find the response to a gradient $\partial B_z/\partial x$, a field $\delta B_z$ is applied only to the magnetometer pickup loop and flux transformer input loop. The current induced in the pickup loop of the magnetometer is $\delta J_m = \eta \delta B_z A_m/L_m$, where $$\eta=[L_p/L_i+1-\alpha(L_m/L_i)^{1/2}A_i/A_m]/(L_p/L_i+1-\alpha^2) \qquad (4)$$

represents the "screening" effect of the flux transformer. This is the amount by which the generated current is reduced (from the value $\delta B A_m/L_m$) due to the presence of the flux transformer. With appropriate design as described herein, $\eta$ is only slightly less than unity so that the sensitivity of the magnetometer itself is not significantly reduced by the presence of the flux transformer.

The inventors of the present invention have fabricated a gradiometer to further demonstrate the principles behind the invention. FIG. 3 shows the configuration of the combination of the directly-coupled magnetometer and flux transformer which forms an embodiment of the asymmetric planar gradiometer of the present invention. The measurements in the figure correspond to the dimensions indicated. As shown in the figure, input loop 112 of flux transformer 110 is placed over magnetometer 122. Input loop 112 is inductively coupled to the pickup coil of magnetometer 122. The distance between the centers of input loop 112 and pickup loop 114 of flux transformer defines the baseline for the device (in this case approximately 48 mm).

As indicated by equation (3), practice of the invention requires that certain relationships exist between the areas and inductances of the magnetometer pickup loop and the flux transformer input and pickup loops, and the mutual inductance between the magnetometer pickup loop and flux transformer input loop (where the mutual inductance is a function of the separation between those two loops). The possible combinations of values of the variables involved are thus constrained to a multi-dimensional solution space. Although computer methods may be used to search the solution space and determine appropriate sets of values for the variables, simpler methods exist for determining a set of values which satisfies the constraints of the problem. One approach is to design a flux transformer and magnetometer pickup loop having area and inductance values which cause the right side of equation (3) to have a value in the middle range of possible values for the coupling constant. This assists in insuring that the fabricated components will have an actual value of the right side of equation (3) which satisfies the constraint that $0<\alpha<1$. After fabrication of the flux transformer and magnetometer pickup loop, the separation between the flux transformer and magnetometer can be adjusted until the "balance" condition is achieved in the presence of uniform background field. This signifies that equation (3) is satisfied, i.e., the coupling coefficient is equal to the right side of equation (3). Equation (4) can then be evaluated to determine the screening effect of the particular flux transformer design.

FIG. 4(a) shows the configuration of YBCO flux transformer 110 of FIG. 3. Note that FIG. 4(a) shows just the flux transformer portion, instead of the magnetometer-flux transformer combination of FIG. 3. FIG. 4(b) shows the configuration of the directly-coupled magnetometer 122 of FIG. 3. The single-layer, directly-coupled magnetometer 122 was patterned by photolithography and Ar ion milling in a 150 nm-thick film of YBCO laser-deposited on a 10×10 mm$^2$ SrTiO$_3$ bicrystal. The outer and inner dimensions of magnetometer pickup loop 124 are 10 mm and 2 mm, respectively, yielding an estimated inductance $L_m$ of 4 nH (nano-henrys) and an estimated area $A_m$ of 20 mm$^2$. The SQUID inductance is estimated to be 50 pH (pico-henrys), including contributions from the two 1 μm-wide Josephson junctions. The critical current and resistance per junction were measured to be 200 μA and 1.2 ΩQ, respectively, at 77 degrees Kelvin. The flux transformer was fabricated from a 260 nm-thick YBCO film co-evaporated on a 100 mm diameter yttrium-stabilized zirconia wafer and patterned by photolithography and etching in a 0.05% aqueous solution of HNO$_3$.

The dimensions of the flux transformer were carefully chosen so that the value predicted by the right side of equation (3) is between approximately 0.4 and 0.8. It is estimated that the inductance and area of the input loop are $L_i \approx 10$ nH and $A_i \approx 36$ mm$^2$, respectively, and that of the pickup loop are $L_p \approx 50 \pm 5$ nH (including a 13 nH contribution from the stripline that connects the two loops) and $A_p = 411$ mm$^2$. From equation (3), these estimated values lead to $\alpha = 0.43 \pm 0.04$, and from equation (4) a value of $\eta = 0.95$; thus the presence of the flux transformer is predicted to reduce the intrinsic sensitivity of the magnetometer by only 5%. As noted, the separation of the midpoints of the input and pickup loops is approximately 48 mm, which is taken to be the baseline of the gradiometer.

The magnetometer and flux transformer were mounted face-to-face, separated by a 2.5 μm-thick mylar sheet and several layers of 50 μm-thick teflon tape. The magnetometer was attached to a fiberglass mount while the flux transformer was attached to a delrin mount the position of which could be adjusted in the x-direction from outside a cryostat by means of a differential screw. In this way, the value of the mutual inductance (and hence α) could be varied in situ to obtain the balance condition of equation (3); the position of the flux transformer could be adjusted to about 2.5 μm. The gradiometer was immersed in liquid nitrogen with the x-axis vertical and the magnetometer at the lower end. No magnetic shielding was used. The SQUID was flux modulated at 100 kHz and operated in a flux-locked loop configuration. To assess the balance of the gradiometer, it was placed at the center of a 1.2-m diameter Helmholtz pair, with the axis of the coils perpendicular to the plane of the gradiometer. A 100 Hz current was injected into the coils and the output was averaged from the flux-locked loop 200 to 400 times, using a spectrum analyzer.

FIG. 5 is a graph showing the amplitude of the output signal (in arbitrary units) of the flux-locked loop which includes the asymmetric planar gradiometer of the present invention. The graph data was obtained for a uniform 100 Hz magnetic field applied at right angles to the gradiometer and the loop output is plotted versus the position (x) of the input loop relative to the magnetometer. The "balance factor" is defined as the ratio of the flux-locked loop output at the x=0 position to that at a position (x). At x=0 the position of the input loop is entirely outside the central hole of the magnetometer pickup loop, and the coupling between them is small. As the input loop is moved towards the opening in the magnetometer loop, the output from the flux-locked loop progressively decreases, dipping sharply near x=4.3 mm, and then increases again. Observations on an oscilloscope showed that the phase of the output signal relative to the driving field changed sign across the minimum. The minimum occurs at the optimum balance point of the gradiometer, and represents a reduction in the response to the applied magnetic field by a factor of approximately 2,930. It is noted that this balance may or may not represent the intrinsic balance limit; it is possible that gradients introduced into the 100 Hz magnetic field by, for example, the steel frame of the building were the limiting factor. The inset graph in the figure shows the data for the region around x=4.3 mm in greater detail.

Another consideration in achieving a useful degree of balance in a gradiometer is that the response to fields applied in the plane of the gradiometer should also be low. To evaluate the response in the y-direction, the dewar was rotated by 90° with the gradiometer unbalanced (x=0) to obtain a minimum response to the 100 Hz field of the Helmholtz pair. This procedure reduced the output of the magnetometer by a factor of approximately 2,500. The gradiometer was then restored to its optimal balance, and it was found that the output increased by about 55%. It is speculated that the increase in response may have been due to a small change in the relative in-plane alignment of the magnetometer and transformer during the adjustment or may represent the non-uniformity of the field produced by the Helmholtz pair. Thus, the balance with respect to transverse fields was taken to be approximately 1 part in 1,500.

As a demonstration of the reduction in ambient noise in the output signal achieved by the present invention, FIG. 6 shows the output of the magnetometer for the unbalanced (x=0, upper trace) and optimally balanced (lower trace) cases, with the signal from the Helmholtz pair switched off. The data is plotted in terms of the flux noise as a function of frequency. It is noted that the 60 Hz peak has been reduced by a factor of 1,600. This reduction is consistent with the balance achieved with the device, although it is also possible that the residual signal arose from a gradient in the 60 Hz field.

The response of the balanced gradiometer to a gradient field $\partial B_z/\partial x$ was also measured, by passing a 100 Hz current through a long wire placed vertically below the gradiometer, parallel to its plane. The distance of the wire from the midpoint of the line joining the midpoints of the two loops of the flux transformer was changed progressively from r=0.5 m to 0.75 m. Note that these distances are substantially greater than the gradiometer baseline. The logarithm of the output signal ($V_O$) from the flux-locked loop for an optimally balanced gradiometer versus the logarithm of the distance (r) of a wire carrying the 100 Hz current below the centerline of the gradiometer is shown in FIG. 7. The least squares fitted slope of the data, $-1.90 \pm 0.05$, is close to the expected value of $-2$. This confirms that the inventive device is operating as a gradiometer; the magnetic field from a wire varies as $1/r$, thus a measurement of the gradient should vary as $1/r^2$. It is noted that distortions in the applied gradient due to nearby conducting objects and, particularly a slight residual response to a uniform magnetic field, will cause deviations from the ideal $1/r^2$ behavior of the field gradient.

Based on the described measurements, the asymmetric planar gradiometer of the present invention achieved a measured balance of better than 1 part in 1,000 with respect to magnetic fields in both the z- and y-directions; the reduction in 60 Hz noise suggests that a comparable value was achieved in the x-direction. Furthermore, the estimated baseline of 48 mm should be sufficient for useful biomagnetic measurements.

The inventive approach to a planar gradiometer described herein has several advantages over the designs of presently available devices. The inventive flux transformer is based on only a single layer of YBCO, and its patterning is undemanding. Because the invention operates on the principle of flux cancellation (rather than current cancellation), flux transformer loops can be fabricated on a separate substrate from the SQUID (in the present case, a SQUID magnetometer). This permits the baseline of the gradiometer to be greater than that possible with currently available devices. For example, the overall length of the transformer could readily be extended to a value such as 100 mm. As noted, this will provide better background signal cancellation and isolation of the desired signal without causing the source signal to be differentiated.

It should not be necessary to use particularly high quality films for fabrication of the flux transformer used in the present invention. In this regard, it has been shown in the previously referenced application entitled "Low-Noise SQUID" that the relatively high levels of intrinsic 1/f noise due to the motion of flux vortices in a flux transformer with a relatively large area and inductance do not contribute significantly to the overall 1/f magnetic field noise of the SQUID sensor. Thus, it may be possible to use sintered YBCO films on inexpensive polycrystalline substrates to fabricate the flux transformer.

The fact that the intrinsic magnetic field sensitivity of the magnetometer is reduced only a few percent by the presence of the flux transformer is particularly appealing for high-$T_c$ devices, in which magnetic field resolution is at a premium. Furthermore, the present invention is not limited to use with such a magnetometer and it is possible to use a high-$T_c$ magnetometer that is more sensitive than the directly-coupled magnetometer described herein. For example, a magnetometer formed from a multilayer, multitum flux transformer coupled to a SQUID could be used. The asymmetric flux transformer described herein could be used equally well with rf SQUIDs, and its simplicity makes it worthy of consideration for low-$T_c$ gradiometers. The general principles disclosed herein could also be extended to the sensing of other, higher order magnetic field derivatives. For example, the addition of a second, identical pickup loop to the flux transformer on the opposite side of the input loop would produce a second derivative gradiometer measuring $\partial^2 B_z/\partial x^2$. In principle, axial gradiometers based on the inventive design are also possible, e.g., using YBCO sintered on a tube. However, in practice such devices may have too high a sensitivity to fields perpendicular to the axis.

In an application such as magnetocardiology, an array of gradiometers could be formed, most likely with the x-axis perpendicular to the chest of the subject, subtracting signals among them to realize higher order gradients. Magnetometers measuring $B_x$, $B_y$, and $B_z$ could additionally be used to reduce the pickup of magnetic field noise. However, in arrays involving more than a very small number of channels it would be impracticable to balance the gradiometers mechanically in the manner described. A more practicable approach would be to couple the flux transformer permanently to the magnetometer in a flip-chip bonded arrangement and to achieve the final balance by laser trimming a specially designed region of the transformer.

The present invention can be used in single and multi-channel superconducting magnetometer systems. One example is an array for biomagnetic measurements. Because of its simplicity and demonstrated performance it can be used to replace other presently available gradiometers. In the field of high-$T_c$, SQUID-based magnetic sensors, the inventive gradiometer uniquely combines a large baseline with a high degree of balance. It may therefore open new applications for high-$T_c$ SQUIDs as they are incorporated in the inventive gradiometer system.

The following issues are relevant to fabricating and characterizing the inventive gradiometer:

1. The gradiometer may be made of any superconducting material deposited on a non-superconducting substrate. Some example materials include, for high-$T_c$ operation, YBaCuO, BiSrCaCuO, TlSrCaCuO, and HgBaCaCuO; for low-$T_c$ operation, Nb, NbTi, Pb, Sn, and Al;

2. Thin films may be deposited by any of a variety of techniques well known in the art, such as, laser deposition, rf sputtering, dc sputtering, evaporation, co-evaporation, or MOCVD. Additionally, conventional thick film techniques may also be used;

3. Substrates may be made from a large number of non-superconducting materials. Some examples include, for high-$T_c$, $SrTiO_3$, YSZ, MgO, $LaAl_3$, buffered silicon, and buffered sapphire; for low-$T_c$, glass, silicon, quartz, and sapphire;

4. Superconducting films may be configured using any of a number of techniques well known in the art, including, photolithography, electron-beam lithography, and shadow masks;

5. There are no presently known theoretical limits to the baseline or other dimensions of the gradiometer;

6. The derivative measured by the gradiometer is not restricted to $\partial B_z/\partial x$, but may be extended to other derivatives. For example, a second pickup loop in the same plane can be added to measure $\partial^2 B_z/\partial x^2$, and loops arranged one above the other coaxially can be used to measure $\partial B_z/\partial z$ or $\partial^2 B_z/\partial z^2$;

7. The flux transformer may be coupled to any kind of magnetometer. Some examples of SQUID-based magnetometers include single-layer, directly-coupled magnetometers, fractional-turn magnetometers, and SQUIDs coupled to a second, intermediary flux transformer which may, but need not, have multiple turns. The magnetometer may be of the high-$T_c$ or low-$T_c$ type. Generally, a high-$T_c$ magnetometer would be used with a high-$T_c$ flux transformer; however, this is not a restriction. Furthermore, the inventive gradiometers are not limited to configurations that include SQUID-based magnetometers, as other magnetometers may also be used;

8. The gradiometer may be balanced by any suitable method. For example simple mechanical adjustments may be employed to reposition the inventive flux transformer with respect to the superconducting magnetometer. Similarly, the superconducting elements can be moved. Perhaps more conveniently, selected portions of the gradiometer may be removed by laser ablation, mechanical scribing or other means to achieve a tuning of the gradiometer after fabrication;

9. Arrays of the inventive gradiometers are useful in magnetocardiology, magnetoencephalography and nondestructive evaluation. Higher derivative gradiometers may be formed by electronic subtraction of outputs from appropriate individual gradiometers to obtain, for example, $\partial^2 B_z/\partial x^2$, $\partial^2 B_z/\partial x \partial y$, and $\partial^2 B_z/\partial y^2$ terms. It is noted that such processing can substantially reduce the level of ambient noise; and 10. The inventive gradiometer may be cooled by any of several well known methods in the art, for example, immersion in a liquid cryogen such as helium or nitrogen, mounting in a vacuum space cooled by a liquid cryogen, or cooling by a cryo-cooler.

The present invention is believed to be the first high-$T_c$ gradiometer incorporating a flux transformer to have a baseline sufficiently long to be useful in practical applications such as magnetocardiology and magnetoencephalography. The invention facilitates the use of SQUID-based sensors for detection of small nearby, time-varying magnetic signals in the presence of a magnetically noisy environment, with the measurements being made without the aid of a magnetically shielded room.

The present invention enables the conversion of any configuration of SQUID magnetometer into a gradiometer by means of a single-layer flux transformer on a separate substrate which is inductively coupled to it. The invention, although primarily intended for high-$T_c$ devices, is equally applicable to low-$T_c$ devices. In addition to its simplicity and its potential for very low cost manufacturing, the flux transformer which is part of the invention reduces the sensitivity of the magnetometer by only a few percent. In contrast, for an optimized flux transformer consisting of two pickup loops of equal size connected in series to a third input coil inductively coupled to a SQUID, the sensitivity of one pickup loop to an applied magnetic field is reduced compared to a magnetometer pickup loop of the same dimensions by a factor of $\sqrt{2}$.

The primary embodiment of the invention described is one in which the flux transformer and magnetometer are formed on separate substrates from high $T_c$ superconducting materials and the flux transformer is formed using thin film techniques known in the semiconductor industry. However, as noted, other designs of the gradiometer disclosed herein are possible and fall within the scope of the appended claims. Such other designs include, but are not limited to; formation of the magnetometer and flux transformer on a common substrate, formation of the magnetometer and/or flux transformer from low $T_c$ materials, and formation of the magnetometer pickup loop and/or flux transformer using thick film techniques or wire.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A gradiometer for measuring a gradient of a magnetic field, comprising:
   a. a magnetometer having a magnetometer pickup loop with an area $A_m$ and an inductance $L_m$; and
   b. a flux transformer wherein the flux transformer comprises
      i. a flux transformer input loop with an area $A_i$ and an inductance $L_i$ formed from a first superconducting material, wherein the flux transformer input loop is inductively coupled to the magnetometer pick up loop; and
      ii. a flux transformer pickup loop having an area $A_p$ and an inductance $L_p$ formed from a second superconducting material and electrically connected to the flux transformer input loop such that a current induced in the flux transformer by any magnetic field is directed in the same direction in both the input loop and pickup loops of the flux transformer, and further, wherein the areas and inductances of the magnetometer pickup loop and flux transformer input loop and pickup loop are selected such that the equation $$\alpha = [A_m/(A_p+A_i)](L_p+L_i)/(L_iL_m)^{1/2}$$

is satisfied, where $\alpha$ is equal to $M_i/(L_iL_m)^{1/2}$ and $M_i$ is the mutual inductance between the magnetometer pickup loop and the flux transformer input loop.

2. The gradiometer of claim 1, wherein the magnetometer further comprises a SQUID device, and further, wherein the magnetometer pickup loop is electrically connected to the SQUID device.

3. The gradiometer of claim 1, wherein the first superconducting material is a high $T_c$ material.

4. The gradiometer of claim 1, wherein the second superconducting material is a high $T_c$ material.

5. The gradiometer of claim 1, wherein both the first and the second superconducting materials are a high $T_c$ material.

6. The gradiometer of claim 1, wherein the magnetometer and flux transformer are formed on a common substrate.

7. The gradiometer of claim 1, wherein the magnetometer and flux transformer are formed on different substrates.

8. A method of measuring the magnetic field flux from a source in the presence of a background field without use of magnetic shielding, comprising:
   a. providing a magnetometer having a SQUID and a magnetometer pickup loop with area $A_m$ and an inductance $L_m$ placed in proximity to the source;
   b. providing a flux transformer which includes a flux transformer pickup loop with an area $A_p$ and an inductance $L_p$ electrically connected to a flux transformer input loop with an area $A_i$ and an inductance $L_i$, wherein the flux transformer pickup and input loops are connected so that a current induced in the transformer by any magnetic field is oriented in the same direction in both the pickup and input loops, and further wherein, the flux transformer input loop is positioned such that it is inductively coupled to the magnetometer pick-up loop with a coupling coefficient $\alpha$, equal to $M_i/(L_iL_m)^{1/2}$ where $M_i$ is the mutual inductance between the magnetometer pickup loop and the flux transformer input loop, and the areas and inductances of the magnetometer pickup loop and flux transformer input loop and pickup loop selected such that the equation $$\alpha = [A_m/(A_p+A_i)](L_p+L_i)/(L_iL_m)^{1/2}$$

is satisfied; and
   c. measuring a voltage across the SQUID.

9. The method of claim 8, wherein the step of providing a magnetometer further comprises:
   providing a magnetometer formed from a SQUID device electrically connected to a magnetometer pickup loop.

10. The method of claim 8, wherein the step of providing a flux transformer further comprises:
   providing a flux transformer having pickup and input loops formed from a high $T_c$ superconducting material.

11. The method of claim 8, wherein the magnetometer and flux transformer are formed on a common substrate.

12. The method of claim 8, wherein the magnetometer and flux transformer are formed on different substrates.

13. The method of claim 8, further comprising the step of:
   arranging the flux transformer so that the magnetometer measures the first derivative of the magnetic field from the source.

* * * * *